United States Patent
Casebolt et al.

(10) Patent No.: US 8,846,177 B2
(45) Date of Patent: Sep. 30, 2014

(54) INTERNAL COMPONENT ADHESIVE SECURING SYSTEMS FOR PORTABLE COMPUTING DEVICES

(71) Applicant: Apple Inc., Cupertino, CA (US)

(72) Inventors: Matthew P. Casebolt, Fremont, CA (US); Kathleen A. Bergeron, Los Gatos, CA (US); William F. Leggett, San Francisco, CA (US); Christiaan A. Ligtenberg, San Carlos, CA (US); David M. Rockford, Cupertino, CA (US)

( * ) Notice: Subject to any disclaimer, the term of this patent is extended or adjusted under 35 U.S.C. 154(b) by 0 days.

(21) Appl. No.: 13/905,034

(22) Filed: May 29, 2013

(65) Prior Publication Data

US 2014/0096889 A1    Apr. 10, 2014

Related U.S. Application Data

(60) Provisional application No. 61/784,349, filed on Mar. 14, 2013, provisional application No. 61/710,660, filed on Oct. 5, 2012.

(51) Int. Cl.

| | |
|---|---|
| *H05K 13/04* | (2006.01) |
| *B32B 3/04* | (2006.01) |
| *B65D 65/02* | (2006.01) |
| *B65D 65/12* | (2006.01) |
| *B65D 65/14* | (2006.01) |
| *B29C 65/00* | (2006.01) |
| *B29C 65/02* | (2006.01) |
| *G06F 1/16* | (2006.01) |

(52) U.S. Cl.
CPC ............ *H05K 13/0469* (2013.01); *B29C 65/02* (2013.01); *H05K 13/046* (2013.01); *B65D 65/02* (2013.01); *B65D 65/14* (2013.01); *G06F 1/1613* (2013.01); *H05K 13/04* (2013.01); *B29C 65/00* (2013.01); *B65D 65/12* (2013.01); *B32B 3/04* (2013.01)
USPC ................ 428/121; 428/43; 156/85; 156/213

(58) Field of Classification Search
CPC . H05K 13/046; H05K 13/0469; H05K 13/04; B32B 3/04; B65D 65/02; B65D 65/12; B65D 65/14; B29C 65/00; B29C 65/02
USPC ............................... 428/121, 43; 156/85, 213
See application file for complete search history.

(56) References Cited

U.S. PATENT DOCUMENTS

| | | |
|---|---|---|
| 8,119,271 B1 | 2/2012 | Bruce et al. |
| 8,432,678 B2 | 4/2013 | McClure et al. |

(Continued)

OTHER PUBLICATIONS

PCT/US2013/060739 International Search Report dated Jan. 10, 2014.

(Continued)

*Primary Examiner* — Michael C Miggins
(74) *Attorney, Agent, or Firm* — Womble Carlyle Sandridge & Rice, LLP (57) ABSTRACT

Methods and systems for adhering internal components in a portable computing device are described. In some embodiments, an internal component adhesive removal system can include a conforming wrapper. In one embodiment, the conforming wrapper can wrap around a portion of an outer surface of the internal component. The conforming wrapper can secure and at least partially enclose the internal component such that the internal component is sufficiently constrained to protect the internal component from damage during movement of the portable computing device during normal use. In some embodiments, the wrapper comprises one or more shock absorbing features. In some embodiments, the wrapper comprises a feature configured to tear to facilitate removal of the internal component from the portable computing device.

23 Claims, 11 Drawing Sheets

(56) References Cited

U.S. PATENT DOCUMENTS

| | | |
|---|---|---|
| 2002/0044408 A1 | 4/2002 | DeLuga et al. |
| 2006/0132095 A1 | 6/2006 | Liao et al. |
| 2007/0065718 A1 | 3/2007 | Moon |
| 2008/0100262 A1 | 5/2008 | Ozaki et al. |
| 2009/0246622 A1 | 10/2009 | Thelemann et al. |
| 2011/0053659 A1 | 3/2011 | Murphy |
| 2012/0141849 A1 | 6/2012 | Lin |
| 2012/0225331 A1 | 9/2012 | Tartaglia |

OTHER PUBLICATIONS

PCT/US2013/060739 Written Opinion of the International Search Report dated Jan. 10, 2014.

Section A-A

INTERNAL COMPONENT ADHESIVE SECURING SYSTEMS FOR PORTABLE COMPUTING DEVICES

CROSS-REFERENCE TO RELATED APPLICATIONS

This application claims the benefit of U.S. Provisional Patent Application No. 61/784,349, filed Mar. 14, 2013, and entitled "INTERNAL COMPONENT ADHESIVE SECURING SYSTEMS FOR PORTABLE COMPUTING DEVICES", and U.S. Provisional Patent Application No. 61/710,660, filed Oct. 5, 2012, and entitled "INTERNAL COMPONENT ADHESIVE REMOVAL SYSTEMS FOR PORTABLE COMPUTING DEVICES", which are incorporated by reference in their entirety for all purposes.

FIELD OF THE DESCRIBED EMBODIMENTS

The described embodiments relate generally to mounting components in portable computing devices. More particularly, improved methods and systems for installing, mounting and removing components in a portable computing device are described.

BACKGROUND

A portable computing device can include many components that provide operational functionality for users of the device. For example, a typical portable computing device can include a processor, one or more fans, speakers, batteries and the like. The sizes of portable computing devices are continually shrinking in response to users' desires for smaller and lighter devices. As a result, there is less space within the housings of the portable computing devices for the internal components. In addition, the internal components should be adequately secured within the housing to withstand jarring and jolting that the portable computing device can experience during normal use. Furthermore, easy access to the internal components can be beneficial when repairing the portable computing device.

One method for securing internal components within a portable computing device includes the use of double-sided adhesive tape. Typically one side of the double-sided adhesive is applied directly onto an internal component and the other side is applied directly onto the housing of the portable computing device. However, double-sided adhesive tape tends to be difficult to remove from surfaces during, for example, a repair process. The force required to remove the double-sided adhesive tape can damage surfaces and components themselves.

SUMMARY OF THE DESCRIBED EMBODIMENTS

This paper describes various embodiments that relate to portable computing devices, and more particularly, mounting systems for internal components of portable computing devices.

In one embodiment, a wrapper arranged to secure an internal component within a portable computing device is described. The wrapper includes a wrapping medium having a length L, having a first end and a second end opposite the first end. In a first folded state, a separation distance between the first end and the second end is equal to the length L. In a second folded state, the separation distance is less than the length L. In the second folded state, the wrapping medium defines a volume having a size and shape in accordance with the internal component such that in a mounting configuration, the internal component is enclosed within the volume and secured to the wrapping medium.

In another embodiment, a method for mounting an internal component in a portable computing device is described. The method includes forming a wrapped assembly by securing and at least partially enclosing the internal component within a cavity formed by folding a flexible film around at least a portion of the internal component and securing a first end of the flexible film to an outer housing of the internal component with a first adhesive and securing a second end of the flexible film to the outer housing of the internal component with a second adhesive. The method also includes attaching an exterior surface of the wrapped assembly to a surface internal to the portable computing device with an external adhesive.

In a further embodiment, a method for mounting an internal component in a portable computing device is described. The method includes attaching a first adhesive to the internal component. The method also includes attaching a heat shrinkable wrapper to the internal component by wrapping the heat shrinkable wrapper around at least a portion of the internal component and affixing the heat shrinkable wrapper to the internal component via the first adhesive. The method further includes shrinking the heat shrinkable wrapper around at least the portion of the internal component by applying heat to the heat shrinkable wrapper. The method additionally includes applying an exterior adhesive to an exterior portion of the heat shrinkable wrapper. The method also includes attaching the internal component and heat shrinkable wrapper to a surface internal to the portable computing device via the second adhesive.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

This paper describes methods and systems for attaching and securing one or more internal components to a portable computing device. A portable computing device can include a laptop, a tablet computer, a thin client, a portable digital assistant and the like. A conforming wrapper can be used to removably affix the internal component to a surface within the portable computing device. In some embodiments the surface is an internal surface of the chassis of the portable computing device. In some embodiments, the surface is of another internal component that is also housed within the portable computing device. The other internal component can include a battery, a fan, a speaker, a printed circuit board and the like. In some embodiments, the wrapper is affixed to more than one surface internal to the portable computing device.

The conforming wrapper can conform to a feature of an internal component, typically an external feature such as a body of the internal component. In one embodiment, the conforming wrapper can include at least one attaching region configured to attach the conforming wrapper to the internal component and at least one attaching region to affix the internal component to the internal surface of the computing device. In some embodiments, the conforming wrapper is a sheet of material formed from a poly carbonate, a polyethylene, polyimide, polyolefin or other suitable material. In one embodiment, the conforming wrapper can also isolate vibrations between the internal surface of the portable computing device and the internal component. Vibrations can be cause by, for example, other internal components within the portable computing device, such as a fan or a disk drive.

Figure 1:
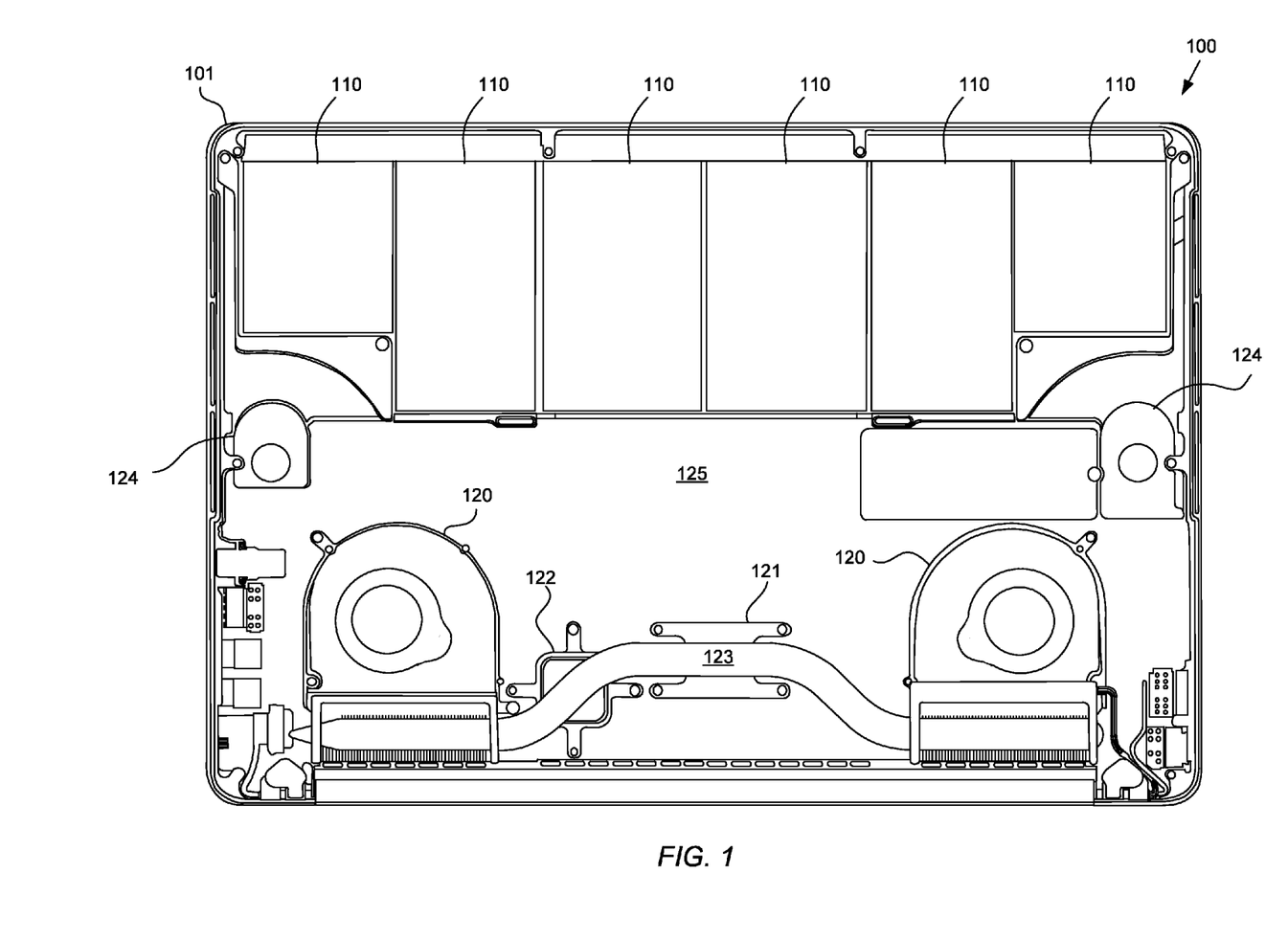
FIG. 1 is an internal view of a portable computer.

FIG. 1 is an internal view of a portable computer 100. The portable computer can include a top case 101 that can be configured to enclose internal components in conjunction with a bottom case (not shown). The portable computer can include internal components such as fans 120, central processing unit 121, graphics processing unit 122, heat pipe 123, speakers 124, motherboard 125 and batteries 110. Other embodiments of a portable computer can include other internal components. Internal components typically need to maintain a relationship with other internal components as well as the top case 101.

Figure 2:
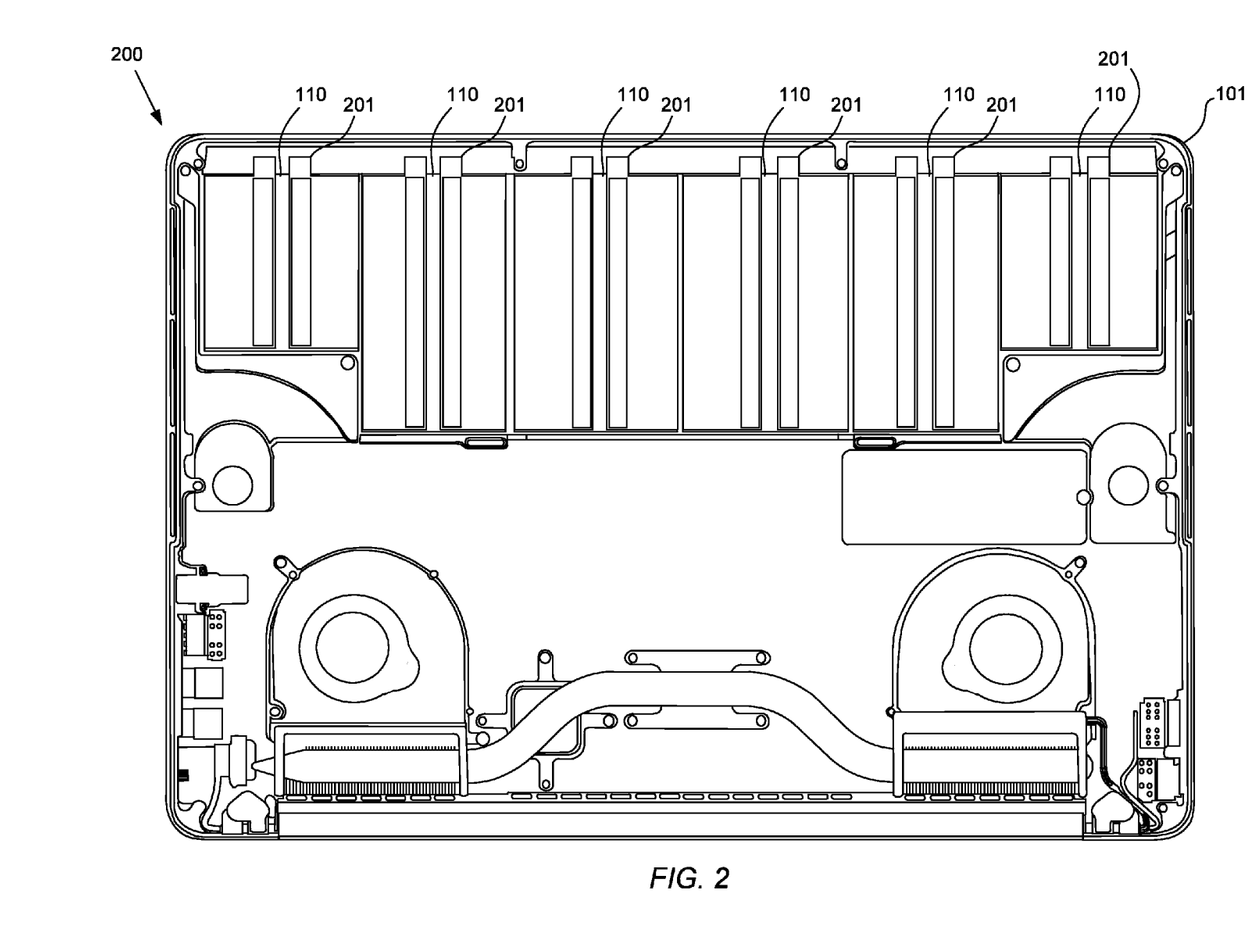
FIG. 2 is another internal view of a portable computer illustrating a conforming wrapper used to affix batteries to a top case.

FIG. 2 is an another internal view of a portable computer 200 illustrating a conforming wrapper 201 being used to affix batteries 110 to top case 101. In other embodiments, other internal components can be affixed with the conforming wrapper 201. In other embodiments, one or more of the fans 120, central processing unit 121, graphics processing unit 122, heat pipe 123, speakers 124, and motherboard 125 can be wrapped with a conforming wrapper. In some cases, the wrapper affixed the internal component and replaces the need for fasteners such as screws and bolts. In one embodiment, each battery 110 can be wrapped with conforming wrapper 201. The conforming wrapper 201 can removably affix the batteries 110 to the top case 101. In other embodiments, wrapper 201 can removably affix batteries 110 to other internal components of portable computer 200, such as the outer casing of a fan, a speaker, or another battery.

Figure 3:
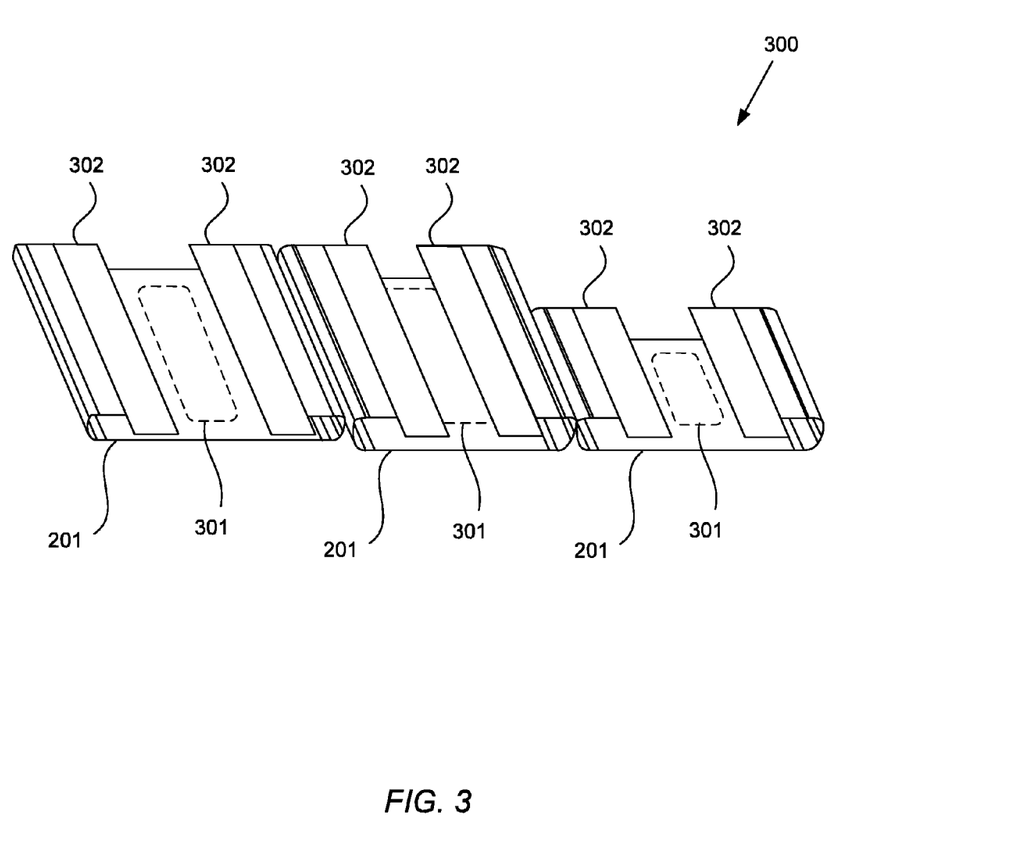
FIG. 3 is a simplified view of one embodiment of the conforming wrapper.

FIG. 3 is a simplified view 300 of an embodiment of conforming wrapper 201. In this view, batteries 110 have been omitted to more clearly illustrate particular aspects of conforming wrapper 201. FIG. 3 in particular illustrates different sizes of the conforming wrapper 201 that can be configured for use on different size batteries 110. The conforming wrapper 201 can include two sides. A first side can be configured to be adjacent to a surface internal to the computing device, the computing device chassis (top case 101) in this example. A second side can be configured to be adjacent to the internal component. The selected material selected to form the conforming wrapper 201 should allow relatively easy conformance to an internal component. The conformance aspect of wrapper can secure the position of the internal component within the chassis during jolting, jarring, a drop event and other movements that the portable computing can experience during normal use. The conformance to the internal component need not be too constraining, however. In one embodiment the conforming wrapper 201 can allow a predetermined amount of change in shape of the internal component while maintaining structural integrity. For example, as battery 110 ages and expands, conforming wrapper 201 should maintain conforming contact with the internal component without breaking and also maintain the attachment of battery 110 to top case 101. The conforming wrapper 201 can be formed from a polycarbonate, a polyethylene, polyimide, polyolefin or other suitable material.

The first side of conforming wrapper 201 can include at least one anchor region 301. Anchor region 301 can be disposed on the first side (i.e., the side facing the top case 101) of conforming wrapper 201. Anchor region 301 can include a shock absorbing or shock compliant material. The shock absorbing material can protect the internal component from damage that can occur during jolting, jarring, drop events and other movements that the portable computing device may encounter during normal use. In one embodiment, anchor region 301 is a laminate formed of an adhesive layer, a foam layer and another adhesive layer. The laminate can anchor the conforming wrapper 201 to an external surface, such as top case 101 or other surface within a computing device, such as a surface of another internal component. Other embodiments can include different laminates and different adhesives. In one embodiment, the foam layer included in the laminate can provide compliant shock absorption between the top-case 101 and the internal component.

Conforming wrapper 201 can also include one or more attaching regions 302 disposed on the second side. The attaching regions 302 can include an adhesive for bonding conforming wrapper 201 to the internal component. In one embodiment, the attaching regions 302 can include an adhesive laminate similar to the laminate used in anchoring region 301. In some embodiments, one or both anchor region 301 and attaching regions 302 can also include features to aid in the release of the internal component from the top case 101. For example, the features can include perforations or cut-out regions within wrapper 201. Some embodiments which include these features are described in detail with reference to FIG. 4.

Figure 4:
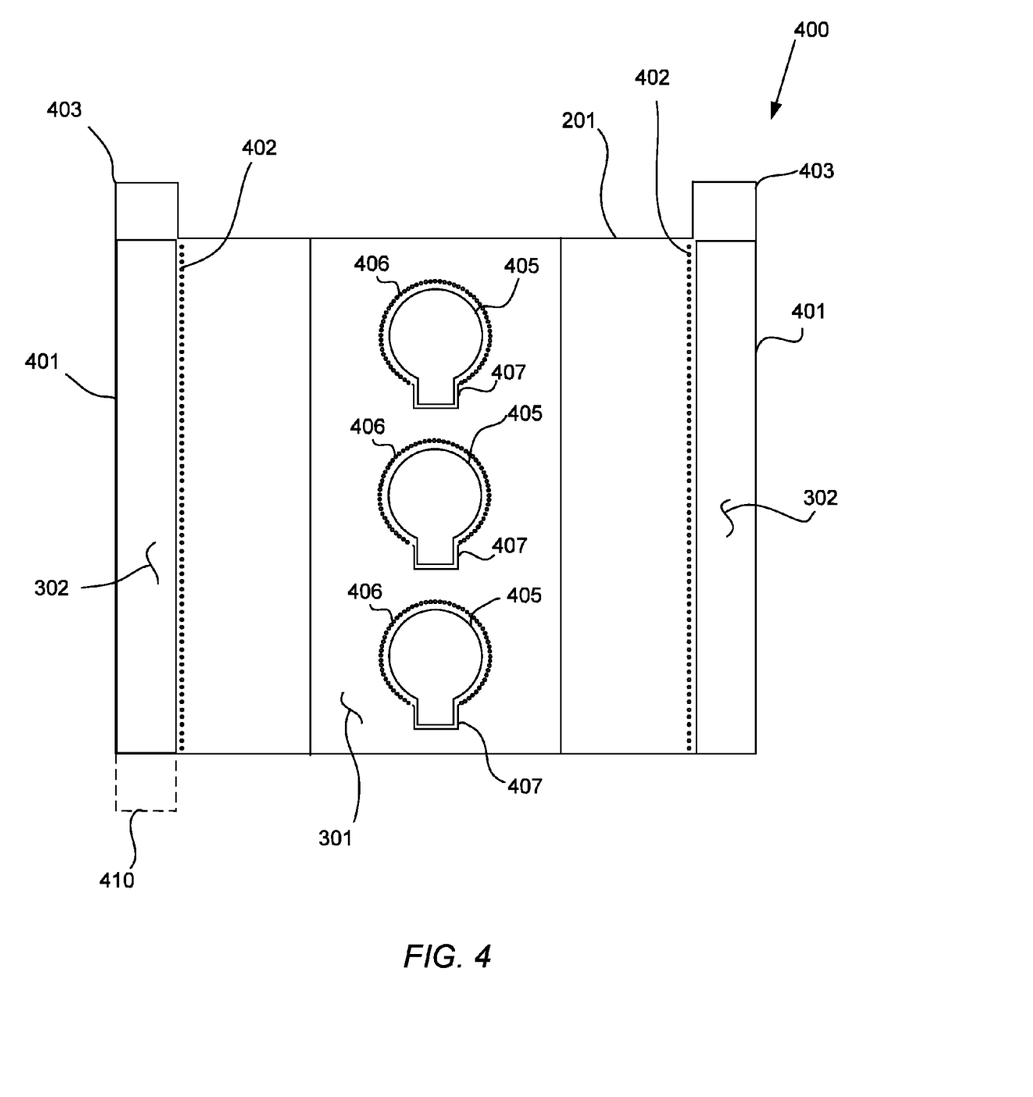
FIG. 4 is a plan view illustration of one embodiment of a conforming wrapper in accordance with one embodiment described in the specification.

FIG. 4 is a plan view 400 of one embodiment of a conforming wrapper 201 in accordance with one embodiment described in the specification. As described above, the conforming wrapper 201 can include attaching regions 302. In this embodiment, two attaching regions 302 are disposed on the second side (i.e., the side facing the internal component) of the conforming wrapper 201. Other embodiments can include other numbers of attaching regions 302. In some embodiments, the attaching regions 302 can be disposed onto a separable region 401 of conforming wrapper 201. Perforations 402 can enable separable regions 401 to be separated from conforming wrapper 201 through tab 403. Tab 403 can be configured to be pulled and act as a handle that can be grasped to separate the separable region 401 from the conforming wrapper 201.

One or more auxiliary attaching regions 405 can be included in conforming wrapper 201. In this embodiment, three auxiliary attaching regions 405 are disposed on the second side of conforming wrapper 201; however other embodiments can include any of a suitable number of auxiliary attaching regions 405. An adhesive can be disposed onto the auxiliary attaching regions 405 and can help bond conforming wrapper 201 to an internal component. In one embodiment, the adhesives can be selected to provide limited strain to the internal component by, for example, selecting a particular sheer component. Optional perforations 406 and optional cutout areas 407 can be disposed adjacent to auxiliary attaching regions 405 and can allow an internal component to be removed from conforming wrapper 201 by separating from conforming wrapper 210, especially when affixed to a chassis or other surface internal to the computing device. Note that in some embodiments, wrapper 201 can include only perforations 406. In and in other embodiments, wrapper can include only cutout areas 407. Illustrated attached to separable region 401 is an optional extension 410 that can be attached to the internal component and can assist in removal of the component from the surface internal to the portable computing device. In one embodiment, extension 410 is attached to the underside of the internal component such that extension 410 can provide leverage for lifting the internal component out of conforming wrapper 201.

Figure 5:
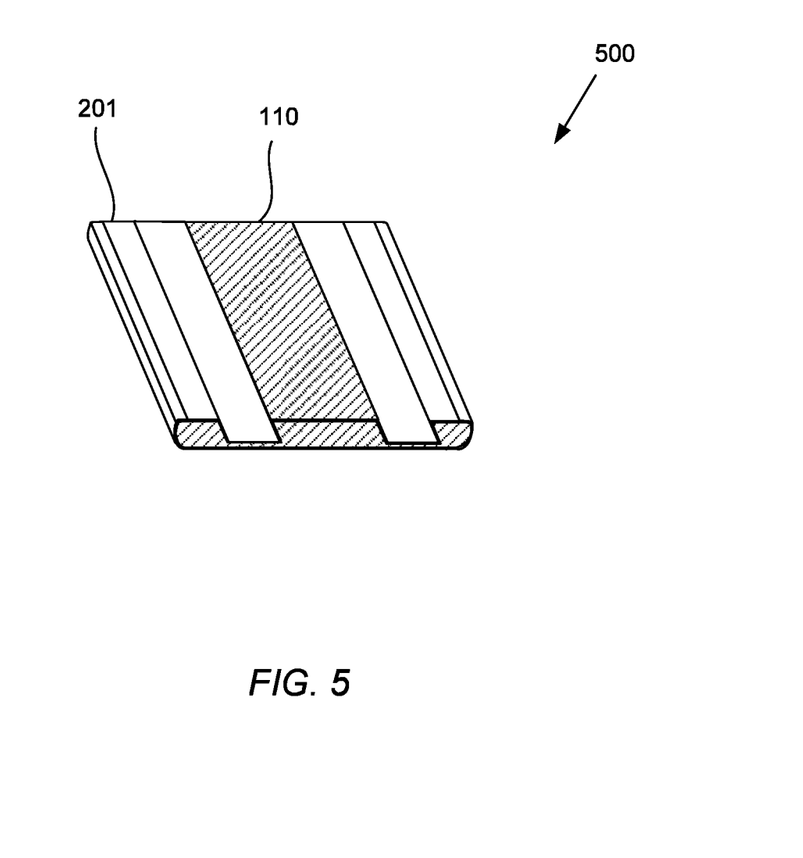
FIG. 5 is an illustration of one embodiment of an application of a conforming wrapper to a battery.

FIG. 5 is an illustration of one embodiment of an application of a conforming wrapper 201 to a battery 110. Note that in this embodiment the conforming wrapper 201 does not completely encircle battery 110 (battery 110 is shown with diagonal lines). In other embodiments, the conforming wrapper 201 can substantially encircle the internal component. In some embodiments, battery 110 has a soft deformable outer housing. As described above, in some embodiments, conforming wrapper maintains conforming contact with battery 110 as battery 110 ages and expands. However, battery 110 can be wrapped tightly enough to constrain movement of battery within a cavity formed by conforming wrapper during typical movements experienced by the portable computing device.

Figure 6:
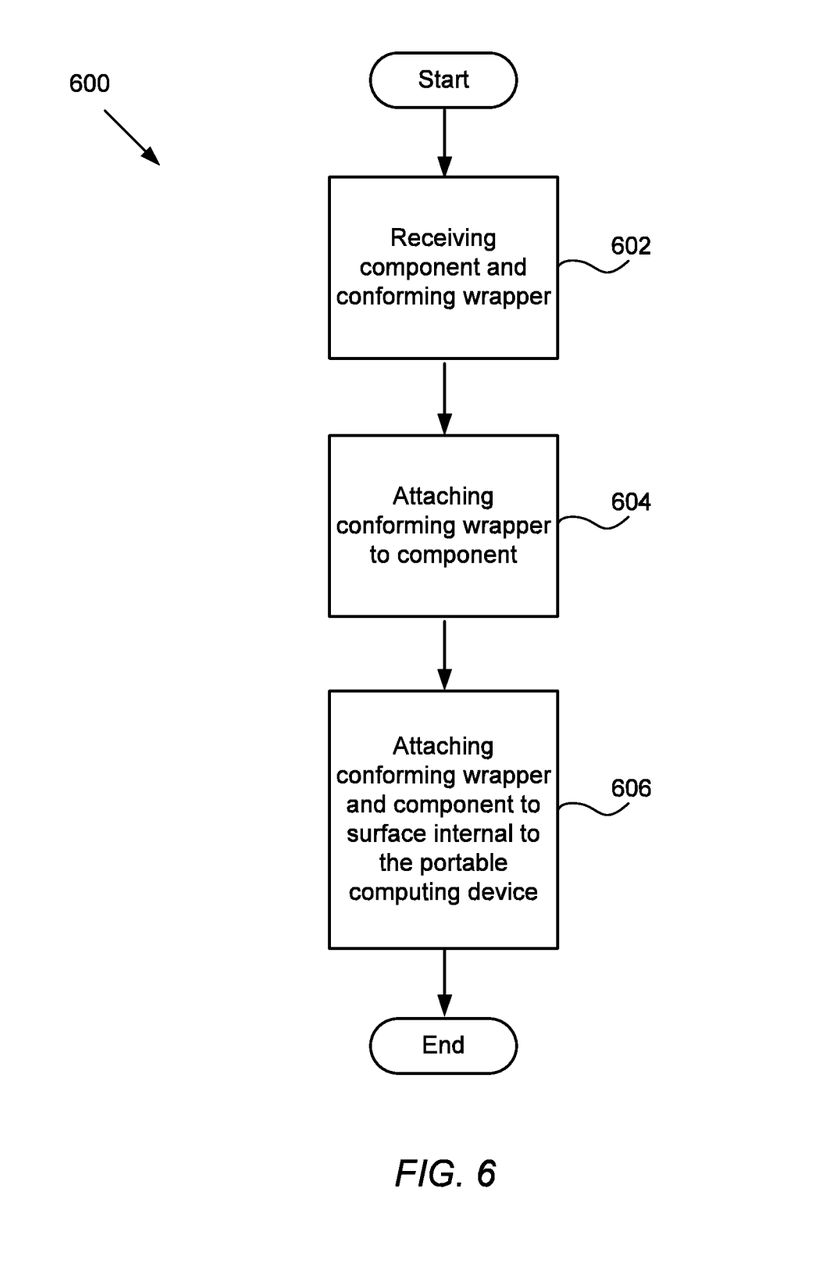
FIG. 6 is a flowchart showing method steps for an embodiment for mounting an internal component in a portable computing device.

FIG. 6 is a flowchart 600 of method steps for attaching an internal component to a surface internal to a portable computing device according to some embodiments. The method begins at step 602 when an internal component and a conforming wrapper are received. As describe above, the internal component can be a battery, a speaker, a fan, a printed circuit board or other suitable internal component of a computing device. The conforming wrapper can be made of a flexible film, such as a sheet of polycarbonate, a polyethylene, polyimide, polyolefin or other suitable material. In one embodiment, the flexible film has a first and a second end. At step 604, the conforming wrapper can be applied to the internal component. In some embodiments, the application of the conforming wrapper includes folding the flexible film around at least a portion of the internal component, securing the first end of the flexible film to the outer housing of the internal component using a first adhesive, and securing the second end of the flexible film to the outer housing of the internal component using a second adhesive. For example, as shown in FIG. 3, in some embodiments, conforming wrapper 201 can be bonded to the internal component at attaching regions 302 using a first and a second adhesive. In some embodiments, more than a first and second adhesive is used to attach the conforming wrapper to the internal component. For example, as shown in FIG. 4, conforming wrapper 201 can also be bonded to the internal component at axillary attaching regions 405. At step 606, the conforming wrapper and internal component can be affixed to a surface internal to the portable computing device. As described above, the surface internal to the portable computing device can include the internal surface of the chassis of the portable computing device or a surface of another internal component such as a battery, a fan, a speaker or a printed circuit board.

According to some embodiments, the adhesives can be bonded to opposing sides of the internal component. For example, the outer housing of the internal component can have a first surface and an opposing second surface. According to some embodiments, the first and second adhesives are attached to the first surface and the auxiliary adhesive is attached to the opposing second surface. In the embodiment shown in FIG. 4, for example, attaching regions 302 of conforming wrapper 201 can be bounded to a first surface of the outer housing of an internal component while axillary attaching regions 405 can be bound to an opposing second surface of the outer housing of the internal component.

In some embodiments, one or more of the first, second and axillary attaching regions have features, such as perforations or cut out regions, that can be torn and facilitate the release and removal of the internal component. In the embodiment shown in FIG. 4, for example, attaching regions 302 have perforations 402 and axillary attaching regions 405 have perforations 406 and cutout areas 407. Perforations 402 can be torn when tabs 403 are pulled to facilitate removal of attaching regions 302 along with corresponding adhesive. Perforations 406 and cutout areas 407 can be torn when the internal component is removed from conformable wrap 201. In some embodiments, perforations 406 and cutout areas 407 can be torn such that axillary attaching regions 405 and corresponding axillary adhesive remain adhered to the surface of the internal component after removal of the internal component from conformable wrap 201. After the internal component is removed, the axillary attaching regions 405 and corresponding axillary adhesive can be removed from the internal component housing more easily and without applying undue stress to the housing of the internal component. This can be particularly beneficial if the housing of the internal component is soft and deformable, such casings for some batteries.

Soft battery casing can be damaged and punctured during a removal process, which can lead to leakage of the battery contents into the chassis. By allowing the adhesive to remain on the battery casing until after the battery is out of the computing device, damage to the housing of the internal component can be avoided.

Figure 7:
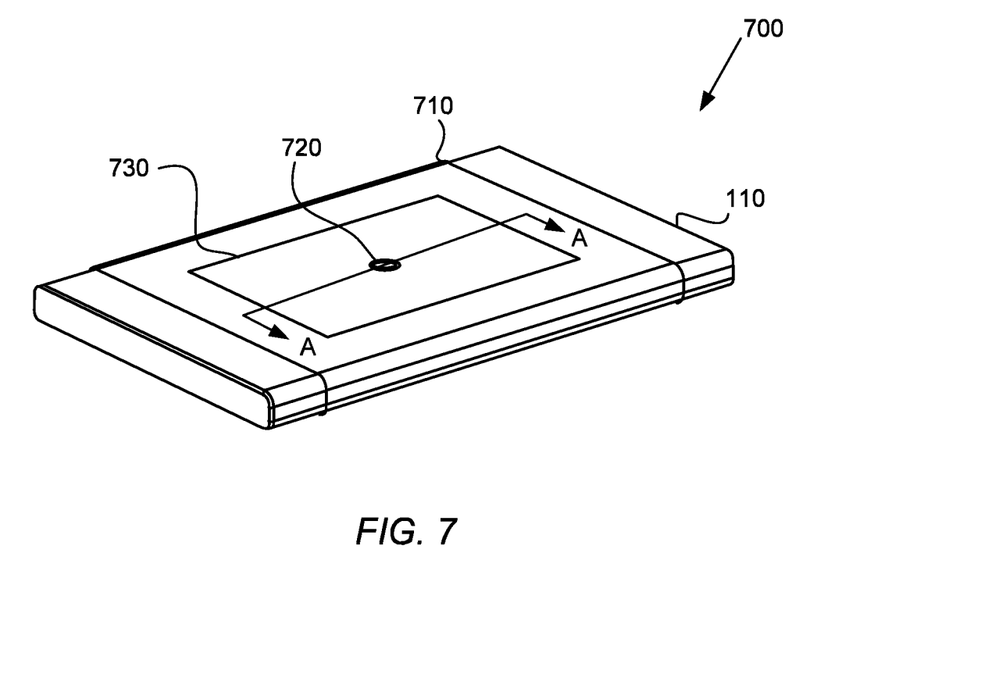
FIG. 7 is an illustration of another embodiment of a conforming wrapper assembly.

FIG. 7 is an illustration of another embodiment of a conforming wrapper assembly 700. Assembly 700 shows battery 110 used to illustrate a possible internal component that can be wrapped with wrapper 710. In alternative embodiments, wrapper 710 can be used with other internal components. In the embodiment shown, wrapper 710 can be a heat sensitive polymer such as a polyolefin compound. For example, wrapper 710 can shrink around battery 110 when heat is applied. Assembly 700 can also include adhesives to constrain the movement of the battery 110 within the wrapper 710 and also attach assembly 700 to the top case 101. Adhesive 720 can be placed on battery 110 and can help establish and maintain a relationship between battery 110 and wrapper 710. Adhesive 730 can be disposed to an outer layer of wrapper 710 and can affix battery 110 to top case. In one embodiment adhesives 720 and/or 730 can include a shock absorbing material. For example, adhesives 720 and/or 730 can be a foam core based adhesive that can include a polyethylene terephthalate (PET) carrier within the adhesive. The PET carrier can enable the foam core based adhesive to be removed as a single piece instead of breaking up into pieces.

Figure 8:
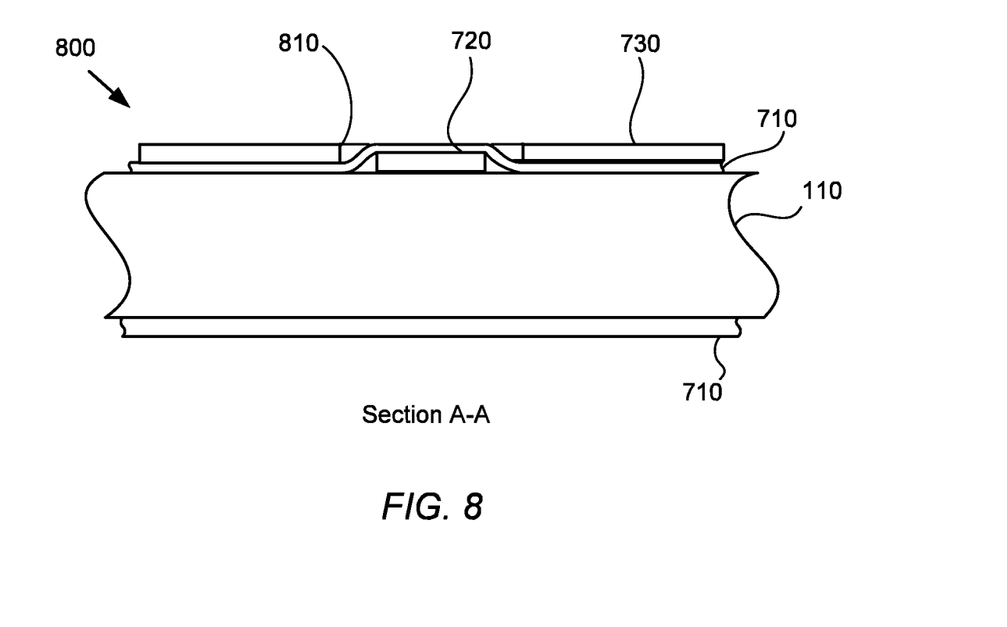
FIG. 8 shows details of section A-A as shown in FIG. 7.

FIG. 8 shows details of section A-A 800 as shown in FIG. 7. Battery 110 is wrapped with wrapper 710. Adhesive 720 is shown disposed between battery 110 and wrapper 710. As shown, adhesives 710, 720 and 730 can have a thickness associated with the foam core base. Adhesive 730 is disposed over wrapper 710 and can include a relief hole 810 to accommodate a thickness related to adhesive 720. The relief hole 810 can allow a substantially planar surface to be presented in the region near adhesive 720 and to reduce the overall thickness of assembly 700.

Figure 9:
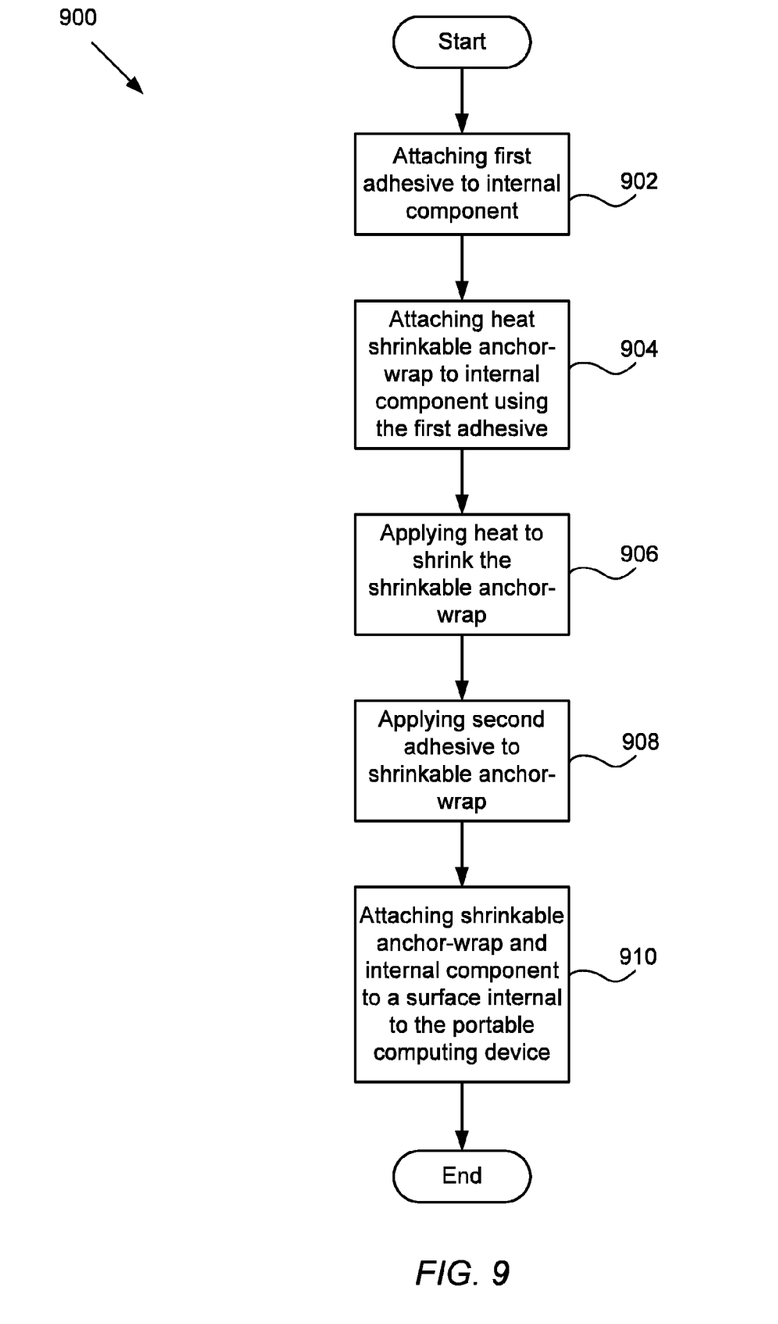
FIG. 9 is a flowchart of method steps of another embodiment for mounting an internal component in a portable computing device.

FIG. 9 is a flowchart 900 of method steps of another embodiment for attaching an internal component to a surface internal to the portable computing device. The method involves the use of conforming heat shrinkable wrapper. In step 902, a first adhesive is applied to internal component 110. In one embodiment, adhesive 720 can be applied to the internal component. In step 906, the heat shrinkable wrapper 710 is placed around at least a portion of the internal component and attached to the internal component via the first adhesive. In step 906, heat is applied to shrink the heat shrinkable wrapper to conform around at least the portion of the internal component. In one embodiment, heat is applied to shrink heat shrinkable wrapper 710 to conform around a portion of the internal component 110. In step 908, a second adhesive is applied to an exterior portion of the heat shrinkable wrapper. In one embodiment, adhesive 730 can be applied to heat shrinkable wrapper 710. As described above, in one embodiment the heat shrinkable wrapper can have an attaching region with perforations for easy removal of the internal component from the portable computing device. In step 910, the internal component and heat shrinkable wrapper are attached to the surface internal to the portable computing device by affixing the heat shrinkable wrapper to the surface internal to the portable computing device via the second adhesive.

Figure 10:
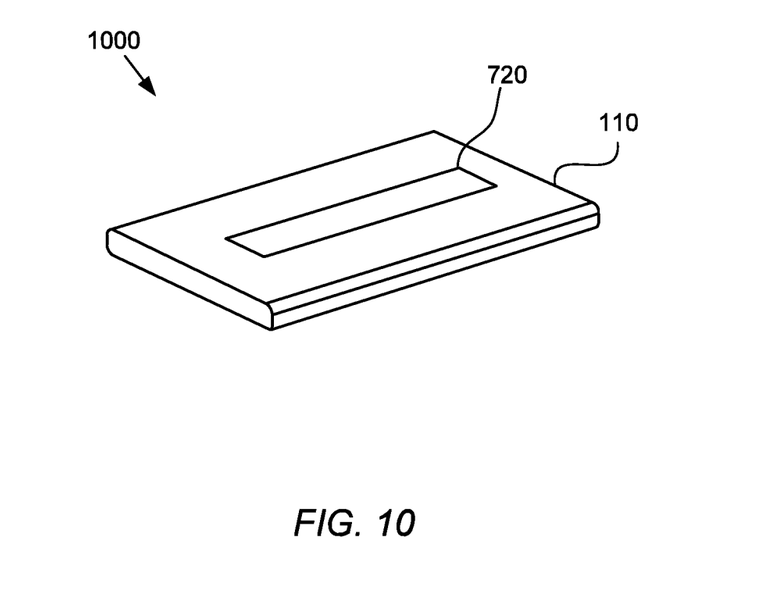
FIGS. 10 and 11 show one embodiment of different phases of the method of FIG. 9.
Figure 11:
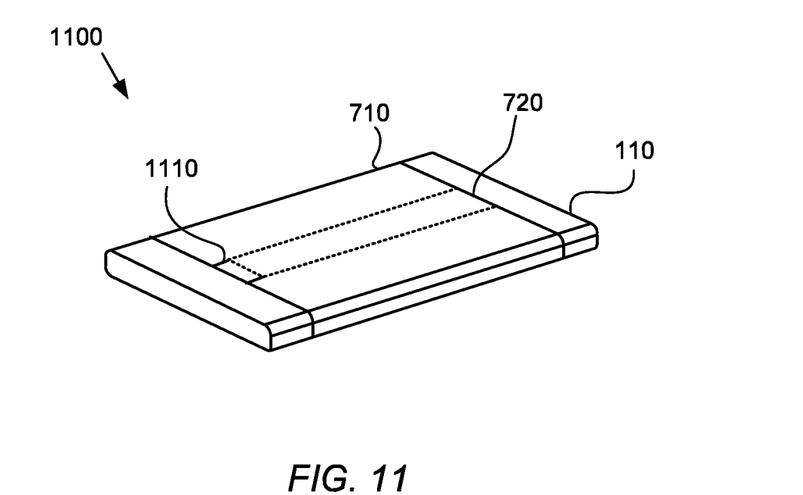

FIGS. 10 and 11 show one embodiment of different phases of the method of FIG. 9. FIG. 10 shows one embodiment of step 904 described above. Battery 110 can receive a first adhesive 720. In one embodiment, the first adhesive 720 can be a foam core based adhesive with adhesive on two sides of the foam core. FIG. 11 shows one embodiment of step 906. In this embodiment, wrapper 710 has been applied over battery 110 and adhesive 720 (shown with dashed lines). In one embodiment, wrapper 710 can include perforations 1110 that can be used to aid in the separation of the wrapper 710 from the battery 110.

Figure 12:
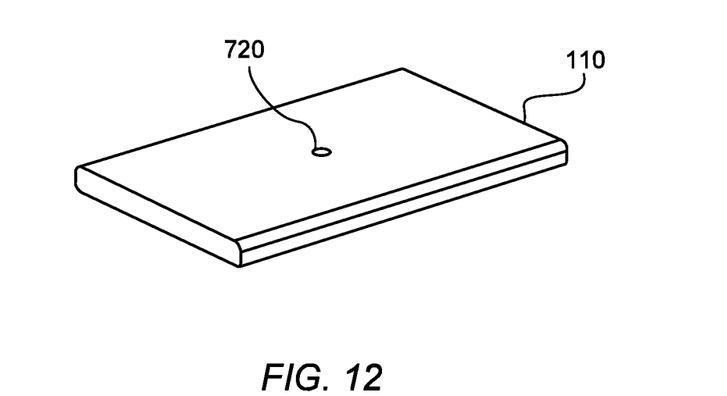
FIGS. 12-14 show another embodiment of different phases of the method of FIG. 9.
Figure 13:
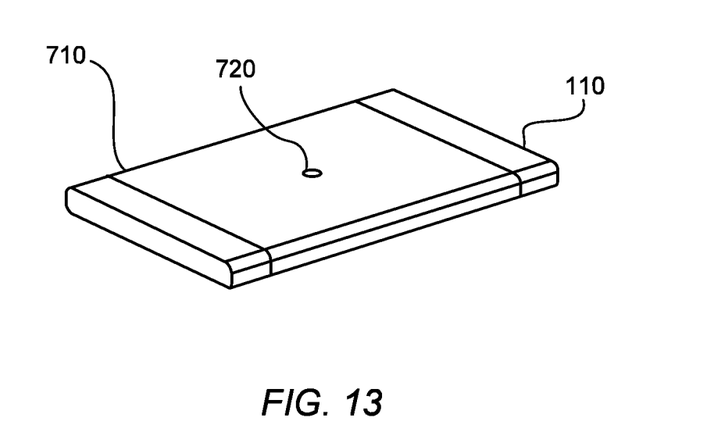
Figure 14:
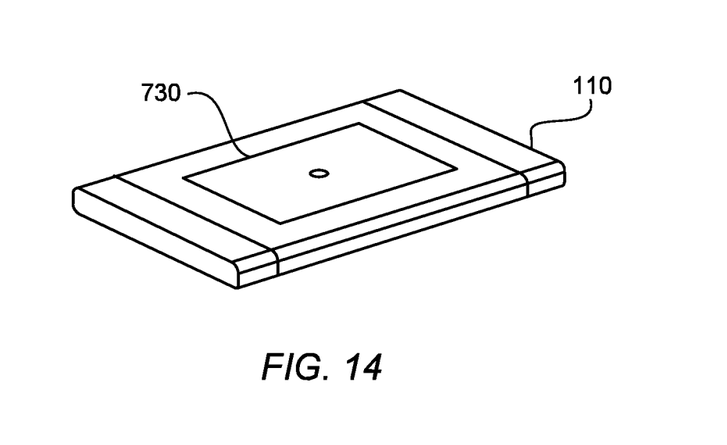

FIGS. 12-14 show another embodiment of different phases of the method of FIG. 9. FIG. 12 shows another embodiment of step 904. In this embodiment, battery 110 can receive first adhesive 720 in the shape of a small disk. In some embodiments, a small amount of adhesive may be all that is required to reduce the motion between wrapper 710 and battery 110. FIG. 13 shows another embodiment of step 906. As shown, wrapper 710 can be applied over battery 110 and adhesive 720. FIG. 14 shows one embodiment of step 908. In this embodiment, second adhesive 730 is applied over wrapper 710.

Figure 15:
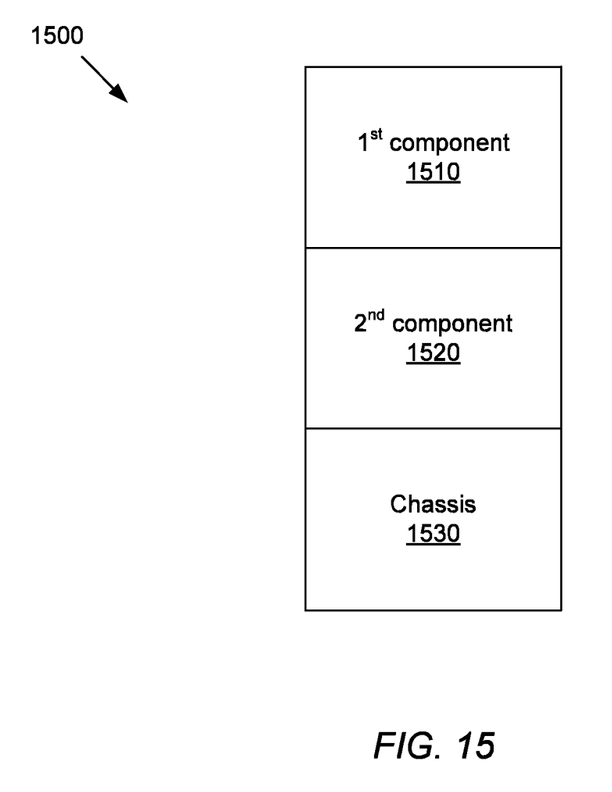
FIG. 15 is a schematic diagram of another embodiment of a wrapper system.

FIG. 15 is a schematic diagram of another embodiment of an anchor wrap system 1500. As shown, an internal component need not be directly anchored to the chassis, but can be anchored indirectly through another internal component. For example, a first component 1510 can be coupled with a wrapper to a second component 1520. The second component 1520 can in turn be coupled to the chassis 1530. Each of first 1510 and second 1520 components can be any one of a number of suitable internal components, for example, a battery, fan, speaker, printed circuit board and the like. Any wrappers that are coupled to first 1510 and second 1520 components can have openings to accommodate communication of the internal components with other internal components.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A wrapper arranged to secure an internal component within a portable computing device, the wrapper comprising:
    a wrapping medium having a length L, comprising a first end and a second end opposite the first end, wherein in a first folded state, a separation distance between the first end and the second end is equal to the length L, wherein in a second folded state, the separation distance is less than the length L and the wrapping medium defines a volume having a size and shape in accordance with the internal component such that in a mounting configuration, the internal component is enclosed within the volume, the wrapping medium comprising:

an anchoring region having at least one first adhesive area configured to secure the internal component to the wrapping medium and at least one second adhesive area configured to secure the internal component within the portable computing device, the second adhesive area surrounding the first adhesive area, wherein the first adhesive area has a surrounding plurality of perforations configured to tear during removal of the internal component from the wrapper.

2. The wrapper of claim 1, wherein in the anchoring region includes a plurality of first adhesive areas, the second adhesive area surround each of the plurality of first adhesive areas.

3. The wrapper of claim 1, wherein the second attachment region is configured to secure the internal component to an enclosure of the portable computing device.

4. The wrapper of claim 1, wherein the second attachment region is configured to secure the internal component to a second internal component within the portable computing device.

5. The wrapper of claim 1, wherein the first adhesive area is arranged to remain adhered to the internal component after removal of the internal component from the portable computing device.

6. The wrapper of claim 1, wherein the wrapping medium conforms to the shape of at least a portion of an outer housing of the internal component such that the internal component is sufficiently constrained to protect the internal component from damage during movement of the portable computing device during normal use.

7. The wrapper of claim 1, wherein the wrapping medium is comprised of a heat sensitive polymer material configured to be heated and to shrink to form a cavity in accordance with the at least a portion of an outer housing of the internal component.

8. The wrapper of claim 1, wherein each of the first and second adhesive areas comprises an adhesive.

9. The wrapper of claim 8, wherein each of the first and second adhesive areas further comprises a shock absorbing material configured to protect the internal component from damage during movement of the portable computing device during normal use.

10. The wrapper of claim 1, wherein the wrapping medium further comprises a first securing mechanism in proximity to the first end and a second securing mechanism in proximity to the second end, the first and second securing mechanisms securing the wrapping medium to the internal component.

11. The wrapper of claim 10, wherein the first securing mechanism comprises a first adhesive and the second securing mechanism comprises a second adhesive.

12. The wrapper of claim 11, wherein the first and second adhesive are affixed to corresponding first and second attaching regions of the wrapping medium, each of the first and second attaching regions comprising perforations configured to tear and assist in separating the first and second attaching regions from the internal component during an unwrapping procedure.

13. The wrapper of claim 1, wherein the internal component is a battery.

14. The wrapper of claim 13, wherein the wrapper is configured to maintain conforming contact with the battery and structural integrity as the battery expands with age.

15. A method for mounting an internal component in a portable computing device, the method comprising:

forming a wrapped assembly by securing and at least partially enclosing the internal component within a cavity formed by folding a flexible film around at least a portion of the internal component and securing a first end of the flexible film to an outer housing of the internal component with a first adhesive and securing a second end of the flexible film to the outer housing of the internal component with a second adhesive; and attaching an exterior surface of the wrapped assembly to a surface internal to the portable computing device with an external adhesive.

16. The method of claim 15, wherein the flexible film is comprised of a heat sensitive polymer material, wherein forming the wrapped assembly further comprises applying heat to shrink the sensitive polymer material around at least the portion of the internal component.

17. The method of claim 15, wherein the outer housing of the internal component comprises a first surface and an opposing second surface and the first adhesive and the second adhesive are disposed on the first surface.

18. The method of claim 17, wherein an axillary adhesive secures the flexible film to the second surface.

19. The method of claim 18, wherein the external adhesive is affixed to a portion of the exterior surface that is proximate to the axillary adhesive.

20. The method of claim 18, wherein the axillary adhesive is attached to an axillary region of the wrapped assembly, the axillary region comprising perforations configured to tear during a subsequent removal of the internal component from the portable computing device.

21. A method for mounting an internal component in a portable computing device, the method comprising:

attaching a first adhesive to the internal component;

attaching a heat shrinkable wrapper to the internal component by wrapping the heat shrinkable wrapper around at least a portion of the internal component and affixing the heat shrinkable wrapper to the internal component via the first adhesive;

shrinking the heat shrinkable wrapper around at least the portion of the internal component by applying heat to the heat shrinkable wrapper;

applying an exterior adhesive to an exterior portion of the heat shrinkable wrapper; and attaching the internal component and heat shrinkable wrapper to a surface internal to the portable computing device via the exterior adhesive.

22. The method of claim 21, wherein the internal component has a first side and opposing second side, wherein the first adhesive is used to affix the heat shrinkable wrapper to the first side of the internal component, and wherein an auxiliary adhesive is used to affix the heat shrinkable wrapper to the second side of the internal component.

23. The method of claim 22, wherein the exterior adhesive is proximate to and on an opposite side of the shrinkable wrapper to the auxiliary adhesive.

* * * * *

UNITED STATES PATENT AND TRADEMARK OFFICE
CERTIFICATE OF CORRECTION

| | | |
|---|---|---|
| PATENT NO. | : 8,846,177 B2 | Page 1 of 1 |
| APPLICATION NO. | : 13/905034 | |
| DATED | : September 30, 2014 | |
| INVENTOR(S) | : Matthew P. Casebolt et al. | |

It is certified that error appears in the above-identified patent and that said Letters Patent is hereby corrected as shown below:

In the Claims:

Column 9, line 16 (Claim 2, line 1): "wherein in the" should read --wherein the--.

Column 9, line 17 (Claim 2, line 2): "areas, the" should read --areas, and the--.

Column 9, line 18 (Claim 2, line 3): "surround" should read --surrounds--.

Column 9, lines 19-20 (Claim 3, lines 1-2): "attachment region" should read --adhesive area--.

Column 9, lines 22-23 (Claim 4, lines 1-2): "attachment region" should read --adhesive area--.

Column 10, line 27 (Claim 18, line 1): "axillary" should read --auxiliary--.

Column 10, line 31 (Claim 19, line 3): "axillary" should read --auxiliary--.

Column 10, lines 32-33 (Claim 20, lines 1-2): both instances of "axillary" should read --auxiliary--.

Signed and Sealed this
Seventeenth Day of February, 2015

Michelle K. Lee
*Deputy Director of the United States Patent and Trademark Office*